United States Patent [19]

Ekstedt et al.

[11] Patent Number: 5,206,582
[45] Date of Patent: Apr. 27, 1993

[54] CONTROL SYSTEM FOR AUTOMATED PARAMETRIC TEST EQUIPMENT

[75] Inventors: Thomas W. Ekstedt, Palo Alto; Mary L. Dryden, Mountain View; Ulrich Kaempf, Los Altos; Richard R. Clark, Redwood City, all of Calif.

[73] Assignee: Hewlett-Packard Company, Palo Alto, Calif.

[21] Appl. No.: 570,998

[22] Filed: Aug. 21, 1990

Related U.S. Application Data

[63] Continuation of Ser. No. 195,667, May 18, 1988, abandoned.

[51] Int. Cl.$^5$ .................. G01R 31/28; G06F 11/22
[52] U.S. Cl. ........................ 324/73.1; 324/158 R; 371/15.1; 371/22.1
[58] Field of Search ............ 324/158 F, 158 R, 73.1; 371/15.1, 22.1, 22.4, 20.1; 437/8

[56] References Cited

U.S. PATENT DOCUMENTS

| | | | |
|---|---|---|---|
| 3,996,517 | 12/1976 | Fergason et al. | 324/158 P |
| 4,038,599 | 7/1977 | Bove et al. | 324/158 P |
| 4,108,358 | 8/1978 | Niemaszyk et al. | 371/22.1 |
| 4,168,527 | 9/1979 | Winkler | 371/20 X |
| 4,354,268 | 10/1982 | Michel et al. | 371/22.1 |
| 4,380,070 | 4/1983 | Steiner | 324/73 R X |
| 4,517,512 | 5/1985 | Petrich et al. | 371/22.1 |
| 4,590,422 | 5/1986 | Milligan | 324/158 P |
| 4,961,053 | 10/1990 | Krug | 437/8 |

OTHER PUBLICATIONS

H. D. Schnurmann, R. M. Peters and L. J. Vidunas, "A System for Testing LSI Multi-Chip Modules Using Through-the-Pins Testing", Proceeding of the International Conference on Circuits and Computers, New York, 28 Sep.-1 Oct. 1982, pp. 334-340, IEEE, New York.

Stephen J. Peterson, "A High Level Test Program Generator for Electronics Manufacturing Test", Electro 1988 Conference Record, vol. 13, 10-12 May 1988, pp. (45/2) 1-6, Los Angeles, Calif., US.

Reinhard Winkler, "Flexible Testing is the Best Testing", Elektronik, vol. 36, No. 21, Oct. 1987, pp. 70-74, Munich, Germany, (English Translation).

*Primary Examiner*—Vinh Nguyen

[57] ABSTRACT

Disclosed is a control system and methodology used for defining and executing parametric test sequences using automated test equipment. The control system is divided into components which separate fixed, reusable information from information which is specific to particular tests. One component contains reference data which describes the configuration of the wafer being tested as well as specifications for the tests to be carried out. Another component contains a set of measurement algorithms that describe individual tests to be performed on generic types of devices or parametric test structures. Execution of a test is carried out by a general test program which retrieves stored reference and test definition information and supplies it to the measurement algorithms to enable them to perform measurements on specific devices in the user specified sequence. The general test program additionally routes the measurement results obtained from the algorithms to data files and/or networks, and summarizes the results in a standardized report format.

14 Claims, 10 Drawing Sheets

(1) GET TEST PLAN FILE
(2) GET CLASS REFERENCE FILE
(3) GET WAFER REFERENCE FILE
(4) GET PROBE REFERENCE FILE
(5) GET CONSTANTS FILE
(6) GET ALL DEVICE-MEASUREMENT FILES
(7) MAKE LIST OF UNIQUE MODULES TO TEST
(8) GET 1st DIE SELECTION FILE
(9) PRODUCE LIST OF UNIQUE ALGORITHMS NEEDED FOR THIS TEST
(10) LOAD THE NEEDED ALGORITHMS
(11) LOOP THRU ALGORITHM REFERENCE FILES TO GET SIZES AND ALLOCATE ARRAYS
(12) LOOP THRU ALG REF FILES TO FILL ARRAYS
(13) ALLOCATE MAIN ARRAY
(14) BUILD MAIN ARRAY
(15) GET OUTPUT FORMAT FILE
(16) GET OUTPUT LIMITS FILE

CONTROL SYSTEM FOR AUTOMATED PARAMETRIC TEST EQUIPMENT

Cross Reference to Related Applications

This is a continuation of copending application Ser. No. 07/195,667 filed on 5/18/88, now abandoned.

BACKGROUND OF THE INVENTION

The present invention relates to automatic test equipment, and more particularly to automated parametric test systems for determining the characteristics of integrated circuits during the development of processes for manufacturing such circuits. More specifically, the present invention is concerned with a system for controlling automated parametric testers in a manner which facilitates the development of tests and improves the documentation, reusability and maintainability of programs for performing testing routines.

In the development of processes for manufacturing integrated circuits, it is necessary to frequently conduct tests on wafers manufactured by the process, to determine whether structures on the wafers meet desired specifications. Accordingly, once a process is developed, a sample of wafers is manufactured in accordance with the process and parametric tests are performed on the wafers to determine the effects the process may have on operating characteristics of circuit devices within the wafer. For example, it may be necessary to determine the gate leakage current of an MOS transistor or the breakdown voltage of a capacitor. During a typical process development cycle, it may be necessary to create several different parametric tests and to frequently modify them in response to test results and other ongoing developments. Once the development of the process is completed, further parametric testing is occasionally carried out to monitor the process.

In the past, the programs for controlling the parametric testing equipment to carry out specific tests on a wafer have been custom designed for each new application. In other words, details concerning the design of the structure to be tested and the specific tests to be performed on that structure were hard-coded into the program. These two different types of information were intertwined throughout the program. For every new wafer design or device that was to be tested, or for each new series of tests that were to be performed on a wafer, an entirely new program had to be written. Even if the same type of structure was to be tested but in a different location from a previously tested structure, new code had to be written to describe the new test.

As integrated circuit processes become more complex and expensive, increasingly more sophisticated and comprehensive parametric tests are being performed in an effort to maximize the information that is obtained from each lot of wafers. Due to the practice of custom designing a control program for each new application, the turnaround time between the development of the new process and the receipt of feedback information relating to that process is becoming unacceptably long. Typically, it might take months for each new program to be written and checked for correctness, and hence information provided by the results of that program can not be obtained in the meantime.

Further, because each program is specifically designed for a particular application, there is generally not much reuse of individual programs. As such, there is very little tendency to document the programs as they are being written, and hence they become difficult to maintain.

BRIEF STATEMENT OF THE INVENTION

Accordingly, it is desirable to provide an environment that enables parametric tests to be more efficiently created and modified, and thereby reduce the turnaround time for test development. In accordance with the present invention, such a capability is provided by means of a test shell in which different functional aspects of the parametric test operation are divided into separate components containing information that can be referred to, as needed, to carry out any desired test. There are three components in the test shell: (1) a configuration file library consisting of reference information and test-definition information, (2) a measurement algorithm library and (3) a general test program. The first component is data; the second two components are programs and subroutines. One subcomponent, the reference information, contains fixed information relating to the configuration of a wafer to be tested, as well as specifications relating to the test equipment. Since this information does not change over time, it only needs to be entered into the system once and can be subsequently referred to as necessary to carry out test procedures.

Another component, the measurement algorithm library contains the subroutines which perform each of the possible types of measurements that can be carried out on each available type of device. Again, these subroutines remain fixed from one wafer to another, and thus need only be programmed into the system once.

Since all of the reference information relating to the configuration of structures and the procedures for performing individual tests are stored in the system, the effort required to define a specific parametric test sequence is reduced to an identification of the individual devices to be tested and the measurements to be performed on each such device. This information, called the test definition information, can be directly provided to the system by the process engineer, and is conveniently entered by means of a suitable worksheet, either on paper or by means of a video display. Once the desired tests have been entered, a general test program, the third component, retrieves the appropriate information from the individual components regarding specific test procedures and the location of the devices on which the tests are to be performed, and controls the testing equipment to carry out these tests.

Since much of the stored information is generic to a number of different types of tests, rather than being dedicated to a specific test, substantial reuse of the information in the components is possible. Such reuse coupled with the fact that this information can be directly entered by the process engineer, rather than a programming specialist, results in a significantly reduced development time. A three-to-tenfold improvement in turnaround time for test development has been experienced with the approach of the present invention. Further, the separation of the details of a parametric test from the program code and the organization of that information into a hierarchy results in self documentating tests and reliable code, making the control system much more maintainable than custom written test programs.

Further features of the present invention and the advantages offered thereby are explained in detail hereinafter with reference to a preferred embodiment and illustrative examples that are depicted in the accompanying drawings.

DESCRIPTION OF THE ILLUSTRATED EMBODIMENTS

To facilitate an understanding of the present invention, a typical parametric test system will be described and the operation of the invention will be illustrated in the context of that system, where appropriate. It will be appreciated, however, that the invention is not limited to the particular type of parametric test system described herein. Rather, the concepts which underlie the invention may be equally applicable to other types of test systems.

Figure 1:
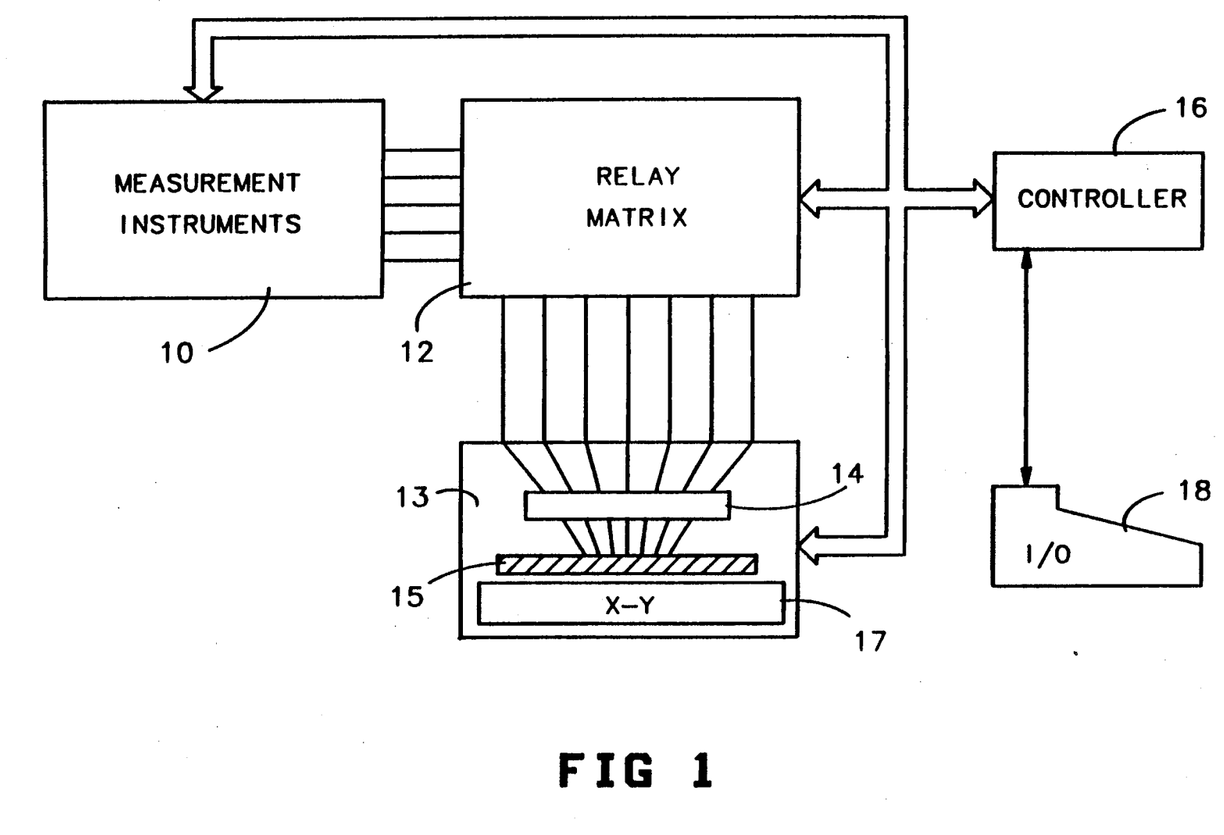
FIG. 1 is a block diagram representation of a parametric test system.

A typical parametric test system is illustrated in block diagram form in FIG. 1. Referring thereto, the parametric test system includes a set of automated measurement instruments 10 which generate the appropriate voltage and current signals to be applied to devices on a wafer and measure the signals generated by the devices in response. The input and output terminals of the measurement instruments are connected to a relay matrix 12. The matrix selectively applies the output signals from the measurement instruments 10 to appropriate probe pins in a wafer prober 13. These pins are located on a probe card 14 and engage contact pads on the wafer 15 being tested. The wafer is positioned relative to the pins by means of a suitable X-Y positioning mechanism 17. The responding signals generated by the devices on the tested wafer appear at the same or other pins on the wafer prober, and are similarly applied to the measurement instruments 10 by means of the relay matrix 12.

The particular output signals that are generated by the measurement instruments, and the probe pins to which these signals are connected by the relay matrix 12, are selected by a controller 16. In addition, the controller 16 controls the positioning of the pins in the wafer prober to place them at a desired location on the tested wafer. The controller 16 can be a suitable desktop computer, for example, which executes a test program stored in its memory such as that provided by the present invention. An input/output device 18 can be used to enter reference and test definition information into files, serve as the operator interface during test execution and display reports relating to the response of the tested wafer.

Figure 2:
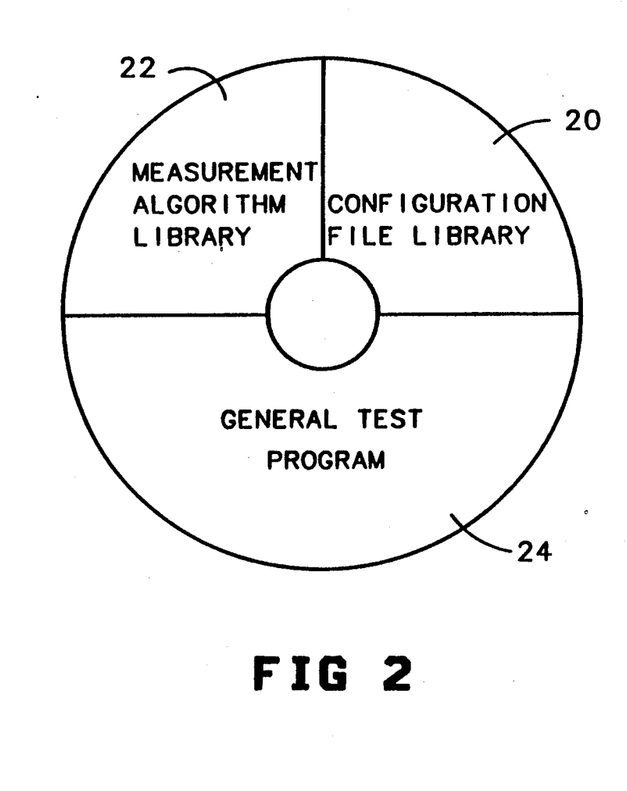
FIG. 2 is a schematic functional illustration of the basic components of a control system implemented in accordance with the present invention.

Referring to FIG. 2, a control program stored in the memory of the controller 16 for controlling a system of the type illustrated in FIG. 1 in accordance with the principles of the present invention is comprised of three major components which can be divided into two functional subsystems. One subsystem involves the definition of tests, and is comprised of a configuration file library 20 and a measurement algorithm library 22. The other subsystem relates to test execution, and is comprised of a general test program 24.

The configuration file library 20 contains two basic types of information, reference information and test definition information. The reference information involves a complete description of the devices on a wafer to be tested and the equipment which implements the tests. Since the structure of the wafer and the equipment remains fixed after it has been produced, this information need only be entered into the configuration file library once, and can be shared by all of the process engineers who desire to perform different tests on the wafer. Test definition information that is also stored in the configuration file library 20 describes the individual tests that are to be performed on specific devices on the wafer. These tests can be different for each engineer who accesses the system.

The measurement algorithm library 22 consists of a set of subroutines. The main purpose of each of these subroutines is to perform specific device measurements, but they are not limited to that function. For example, one subroutine may describe the sequence of steps necessary to measure the threshold voltage of an FET, and another subroutine may describe the test procedure for measuring diode leakage current. Other measurement algorithm subroutines can be written to print special reports, plot test data to the video screen or perform calculations on the data such as linear regressions.

The general test program 24 interprets the information stored in the configuration file library 20 and calls subroutines from the measurement algorithm library 22 to perform actual wafer testing. This program contains standardized versions of all administrative functions common to each test, such as hardware initialization, operator interface, measurement sequencing, data routing and storage, etc. In response to the test information entered into the configuration file library by the user, the general test program 24 positions the wafer prober 14 and accesses the appropriate measurement algorithms which switch the relay matrix 12 and control the actuation of the measurement instruments to carry out the desired testing. The general test program also generates appropriate output reports on the input/output device 18.

Figure 3:
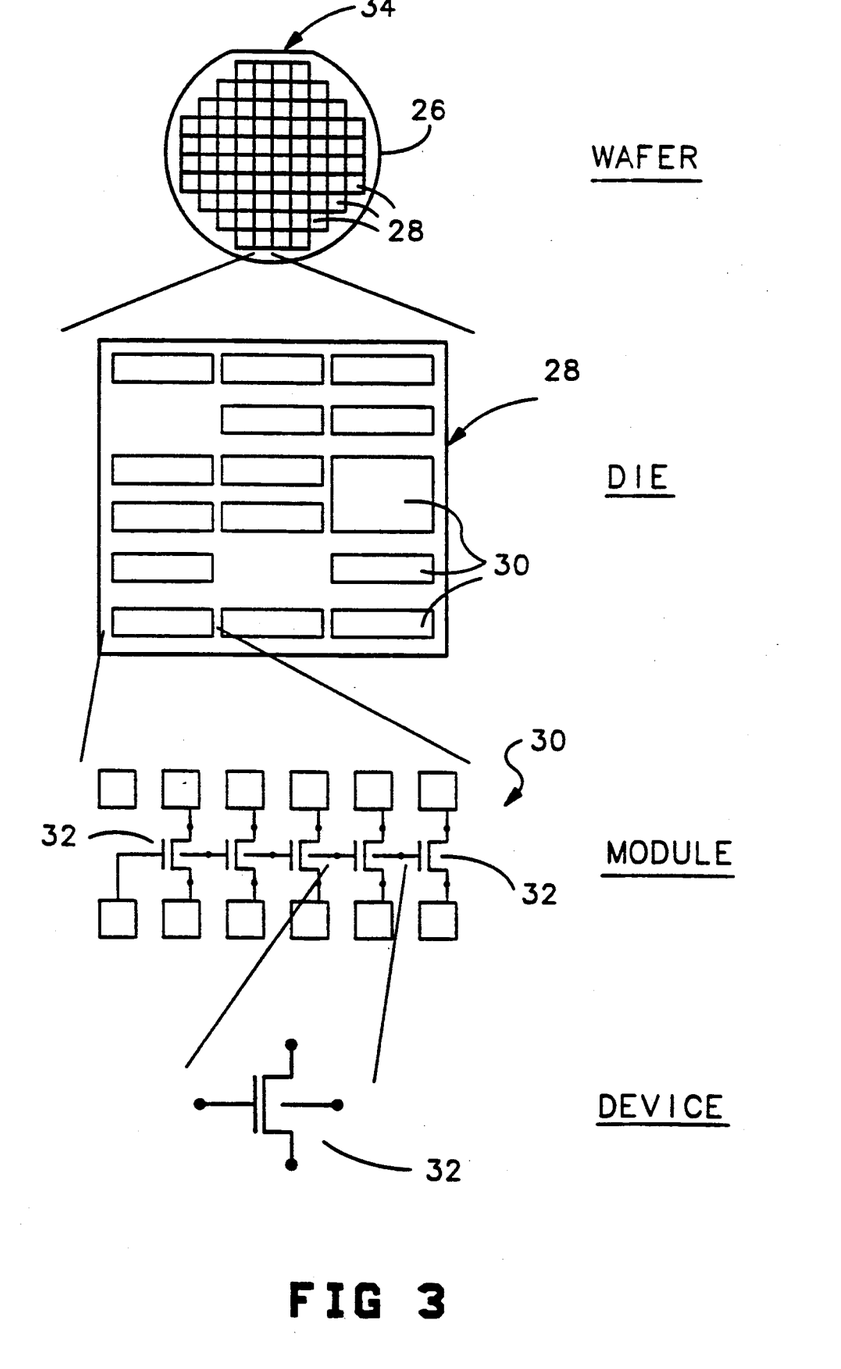
FIG. 3 is a pictorial and schematic illustration of the hierarchy of reference information relating to the layout of a wafer.

By separating the information necessary to conduct the tests into separate components in this manner, each engineer need only be concerned with that aspect of the program which pertains to his particular area of expertise. For example, the process engineer who is only interested in the results of certain tests does not have to be generally familiar with the overall layout of the wafer in order to obtain the information he desires. Rather, the layout information can be entered into the program by the mask engineer who is most familiar with it. Referring to FIG. 3, the layout of a wafer is illustrated in a hierarchical form. Each wafer 26 consists of a two-dimensional array of dice 28. Generally, a wafer might contain 100-200 dice. Typically, every die on a wafer will be the same, although it is possible to have the dice vary from one another. Each die consists of an arrangement of modules 30, which can be the same or different from one another. A module is defined as the largest area that can be covered by the set of probe pins in the wafer prober. Each module consists of one or more devices 32, e.g. transistors, diodes, resistors, etc. having terminals connected to contact pads within the module.

As a convenient means to enter information into the configuration file library, the mask engineer can fill out a series of worksheets (either on paper or directly into computer memory by means of a video display) that are respectively related to the tiers of the hierarchy shown in FIG. 3. One worksheet, referred to as a wafer layout worksheet, can describe information such as the wafer dimension, die-to-die distances, and die outlines. Thus, this worksheet identifies the specific location of each die relative to a reference position defined by the user. This reference position can be on the wafer itself, or at a location that is not on the wafer but is fixed relative thereto. For convenience, the positions of the dice, and more particularly a specific point on each die such as a corner, can be specified by means of a first set of X-Y coordinates whose origin is the reference position, to thereby accommodate non-uniform die spacing on the wafer.

A second type of worksheet, the die layout worksheet, can define the arrangement of modules within each type of die. In conjunction with this worksheet, a module coordinate worksheet can be employed to describe the location of each module within the die. In addition, this worksheet can describe the number of contact pads, their dimensions, relative arrangement and the distances between contact pads. A precise location on one of the pads, such as its center, can also be identified for reference purposes. Preferably, this location is identified using a second X-Y coordinate designator. The origin of this coordinate system could be the specific point on the die, e.g. a corner, that is identified by means of the first coordinate pair described previously. Thus, any point on the wafer can be specified by means of two vectors, the first of which points to a particular die and the second of which identifies the point within the die.

Finally, a module design worksheet can be employed to describe the arrangement and construction of devices that are located within each type of module. Each device within the module can be labeled, and each of its terminals can be assigned to one of the pads in a previously defined pad pattern layout for the module.

In addition to the information describing the makeup of the wafer, other information describing the pin arrangement for each type of probe card used in the wafer prober can be contained in the reference data portion of the configuration file library. For example, each pad in a given pad pattern can be correlated with one of the pins on the probe card as well as its associated contact point within the relay matrix.

An advantage of the methodology of the worksheet layout is that it enables the engineers to enter information and construct tests in terms that are familiar to them. The engineers can write the reference and test definition information either on paper worksheets or directly onto the video display "worksheet". Once all of the worksheets/screens have been completed by the engineers, the information contained in them is stored in structured files within the configuration file library 20. Preferably, the worksheets are organized in a manner which corresponds to the format of the files in the library. This approach reduces the level of skill required to store the information in the files in case paper worksheets are used.

Besides the reference information describing the layout of the wafer and characteristics of the testing equipment, the configuration file library 20 contains test definitions or specifications. These specifications define the selection of dice and devices where testing is to be carried out, the type of measurements to be performed, the test conditions for these measurements, the format for the output information and the desired information for operator entry. Similar to the reference information, the test definitions can be provided by means of suitable worksheets. In contrast to the reference information, however, the test information is not provided by the mask designer. Rather, it is entered by the device or process engineer who requires the information provided by the tests to monitor and/or refine the manufacturing process. Each engineer can give each test sequence which he defines a unique name that later enables an operator to call up the test as desired.

Similar to the configuration of the wafer, the test sequence is also laid out by the engineer in a hierarchical format. The levels of the hierarchy are shown in FIG. 4, and each can have a corresponding worksheet to define the test sequence.

Figure 5:
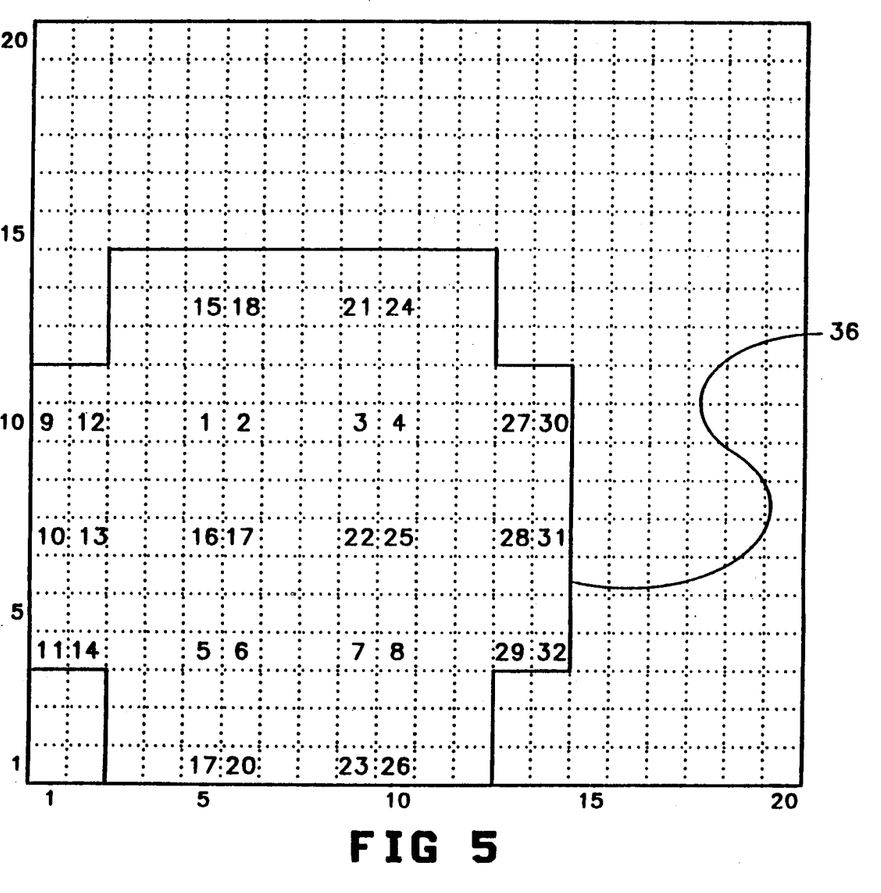
FIG. 5 is an example of a die selection matrix.

Typically, in parametric testing it is not necessary to perform tests on every die within the wafer. Rather, testing need only be performed on selected dice at various locations within the wafer to determine certain characteristics of the manufacturing process. Therefore, a first step in the definition of the test specifications is to describe those die sites at which parametric testing is to be carried out. FIG. 5 illustrates an example of a worksheet that is marked to identify the particular dice in the wafer that are to be tested. The outline of all of the dice is indicated by the solid line 36, and the individual dice are defined by the dotted-line squares within this outline. The selection of the dice to be tested can be indicated by placing an "X" or similar checkmark within each desired die on the worksheet. In such a case, the dice would be sequentially tested in a predetermined pattern. For example, the wafer prober might start with the die in the upper right-hand corner of the wafer, proceed horizontally across the row, step down to the next row, and continue along such a path, stopping at each selected die in order as it is reached.

The test shell approach of the present invention offers a much greater degree of flexibility in the die test sequence, however. Rather than being confined to a limited set of predetermined patterns, the dice can be tested in any random order. As shown in FIG. 5, each selected die to be tested can be sequentially numbered in accordance with any desired test pattern. Thus, it is possible to begin the test procedure with dice in the center of the wafer, and then proceed to other dice located at the periphery of the wafer, for example.

Figure 4:
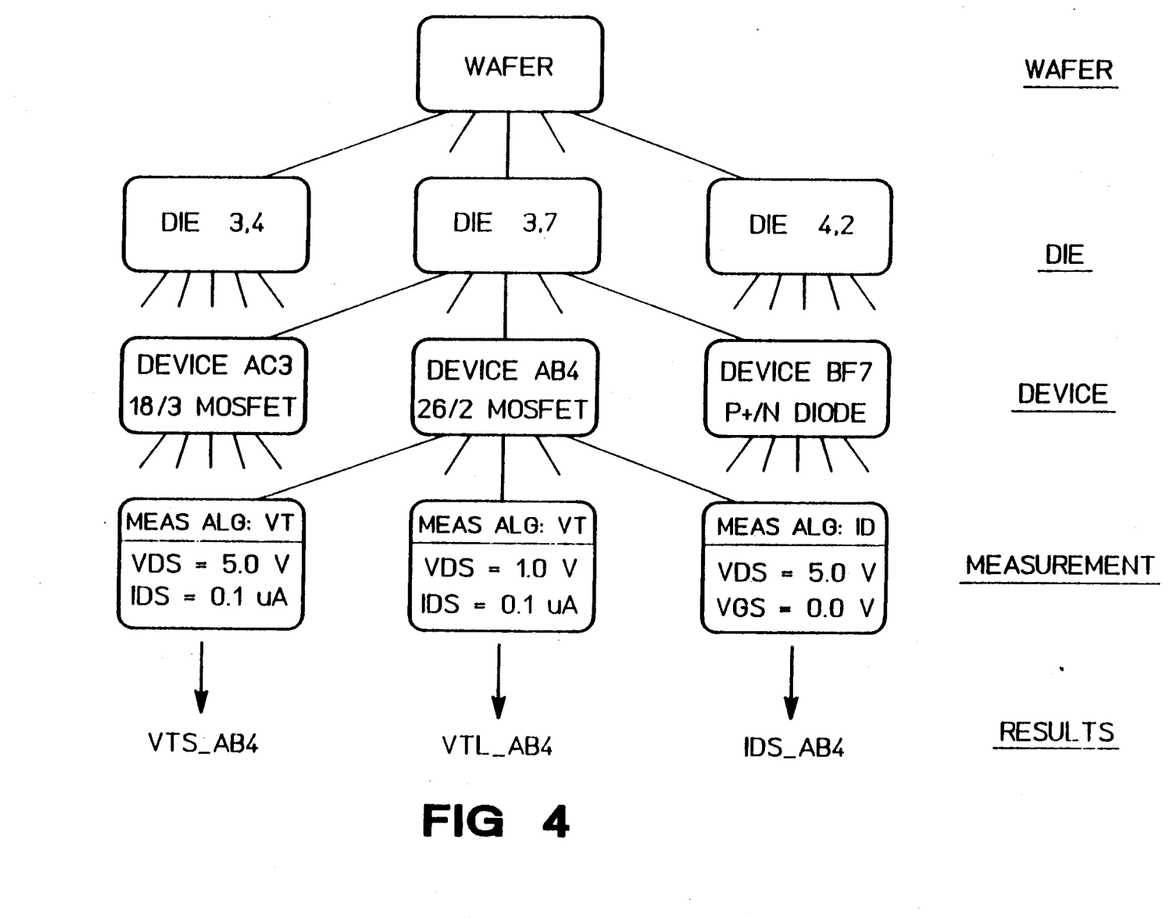
FIG. 4 is a schematic illustration of the test sequence hierarchy.

Once the dice to be tested have been selected, the specific devices as well as the types of measurements that are to be performed on each device within a die are specified, as illustrated in the third and fourth levels of the hierarchy shown in FIG. 4. Basically, each type of measurement can be assigned an arbitrary name by the device engineer, and the devices to which each such measurement is to be applied can be indicated on a suitable worksheet.

Figure 6:
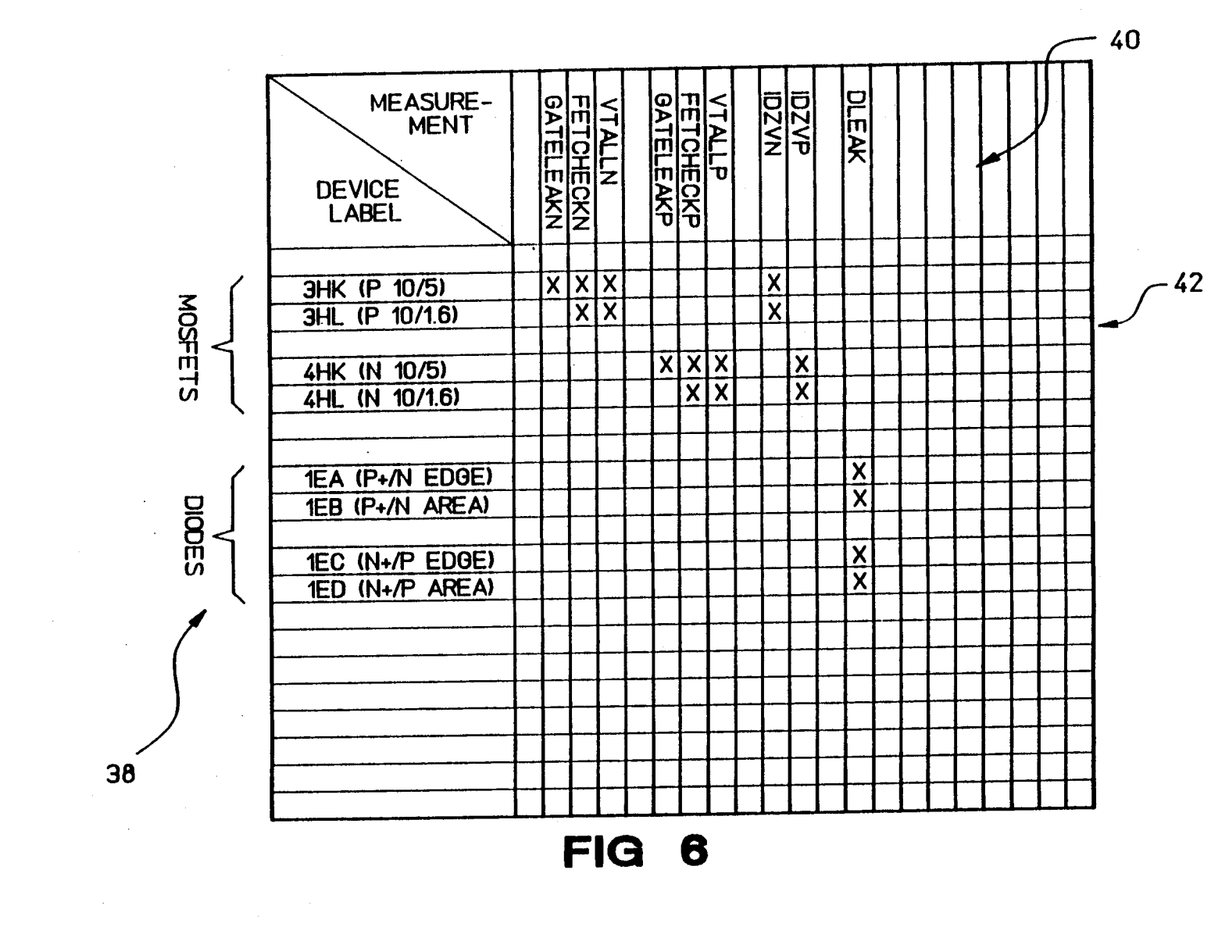
FIG. 6 is an example of a device/measurement selection matrix.

An example of such a worksheet is shown in FIG. 6. The labels of all devices to be tested are listed in a column 38 along the left-hand side of the worksheet. These labels are preferably specific to a single device on each die. A row 40 along the top of the worksheet contains the name of each different type of measurement to be performed, e.g. gate leakage, drain current, etc. The application of a particular measurement to a specific device can thereby be easily identified by placing an "X" at the appropriate location in the matrix 42 defined by the worksheet. The engineer also selects the order of test using this matrix. The specified tests, designated by "X", are processed top left to bottom right by rows. All tests on the first device in the top row are performed before proceeding to the next device. This minimizes pad contact and prober movement while at the same time allows the engineer a high degree of flexibility unavailable in standard probing patterns. Thus, the process engineer's task to define a test sequence is not only greatly simplified in that the device/measurement matrix provides a compact overview of the entire test, but is made considerably more flexible, too.

Another worksheet can be used to describe the particular test conditions for each named measurement, as well as to assign a label to the results from each measurement. For each identified measurement, one or more suitable measurement algorithms can be chosen from the measurement algorithm library 22 to perform that identified measurement. In addition, parameters for the measurement, such as voltage levels, can be specified. In a preferred implementation of the invention, these parameters can be specified in any one of three forms. First, each might be simply listed as a fixed, numerical value. Secondly, a parameter can be assigned a name which is given a numeric value based upon user defined constants or variables which are given values by the user at the time of test execution, or as a result of a prior measurement performed on the wafer. Third, the parameter can be specified as an arithmetic expression defined in terms of fixed numerical values and/or named values as noted above. Thus, the programming approach of the present invention facilitates parameter passing, i.e. the use of the result from one test as an input condition to a subsequent test within the same test sequence.

Finally, the user can identify the particular output results that are to be included in any desired report, as well as specify the destination for the report, e.g. video screen or printer. Once the user has entered all of this information onto the appropriate worksheets/screens it is stored in corresponding files in the configuration file library 20.

As indicated previously, the measurement algorithm library 22 contains software subroutines which perform specific measurements on test device structures by controlling the instrumentation 10 of the test system. Each subroutine can perform a specific type of measurement. These measurements are not unique to an individual device on a wafer that is being tested, however. Rather, each measurement algorithm is a standardized procedure for a generic but user definable class of device. The characteristics of an individual device under test, as it relates to the class of devices, is provided by the general test program 24 during the test procedure, from information read from the configuration file library 20.

An example of a class of device is a gated two-terminal diode which is defined as a diode structure having a top electrode, a bottom electrode and a gate terminal. The definition of the class may also include provisions for a substrate terminal and a wafer chuck terminal. In addition to these "structural" definitions, the device can also be described in terms of certain variables. For example, the gated two terminal diode can be described in terms of the area of the diode junction, the length of the junction perimeter, the area of the gate, the length of the gate perimeter, the amount of overlap of the diode junction by the gate, the type of dopant, i.e. p or n, used for the top diode electrode and the type of gate. When a test is being run on a specific device in this generic class, the general test program utilizes the information stored in the configuration file library to indicate to the measurement algorithm the respective contact pads in a module which are associated with the terminals of the diode, as well as the values for the parameters which describe the diode structure.

Other examples of various device classes include island isolation structures, line width structures, MOS capacitors and field effect transistors, contact strings, etc. Users may define and add new device class definitions by completing appropriate worksheets/screens.

To further facilitate an understanding of the measurement algorithms contained in the library 22, reference will be made to a specific algorithm for checking the quality of an MOS field effect transistor. The configuration of the system for carrying out this measurement is illustrated schematically in FIG. 7. Referring thereto, an FET 44 is a class of device that is defined as having six terminals. The gate, drain and source terminals of the device are respectively labeled G, D and S in FIG. 7. In addition to these three terminals, the device is defined as having a bulk terminal B, a substrate terminal and a wafer chuck terminal.

The measurement algorithm for checking the quality of an FET contains three sets of input variables and one set of output variables. One set of input variables to the algorithm comprise information which associates each of these defined terminals of the device to a specific pad in a particular pad pattern. Thus, when a selected MOSFET is to be tested for its quality, reference information stored in the configuration file library 20 indicates the particular pads in a pad pattern that are respectively associated with each of these defined terminals for the device.

Another set of input variables relate to design characteristics of the device. Specifically, the mask channel width, mask channel length and dopant type of the channel can be stored in the configuration file library 20 and supplied to the measurement algorithm at the time the tests are being carried out on the device.

The third set of input variables relate to measurement parameters which are assigned specific values by the process engineer. These parameters can include the drain-to-source bias voltage, gate-to-source bias voltages for the "off" and "on" states of the transistor, maximum acceptable drain currents for each of the two states, and bulk-to-source bias voltage. If desired, an integration range can be specified for the ammeter which measures the drain current. The integration range determines the precision of the measurement.

The output variables for the measurement algorithm can include the drain currents for the "off" and "on"

states of the FET, as well as a general indication of the status or quality of the FET based on these other two values.

Figure 7:
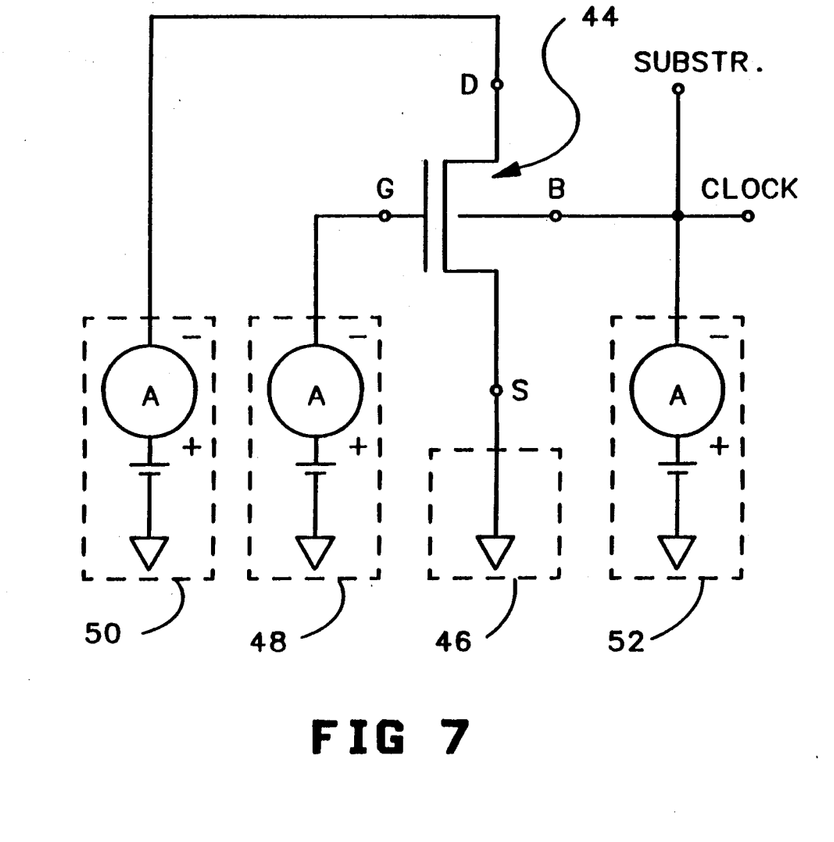
FIG. 7 is a schematic circuit diagram illustrating a MOSFET circuit device as configured for a quality check measurement.

After defining each of these input and output variables, the measurement algorithm identifies the step-by-step procedure to be carried out to perform the desired measurement. A first step in the procedure would be to lower the probe onto the pads of the device, if this step has not been previously performed in connection with another measurement. The next step would be to establish the values for various voltage sources, or source measurement units (SMUs), in the measurement instruments 10 and the connections of these units to the pads of the device. Referring to FIG. 7, four SMUs are employed in the measurement. One SMU 46 is set to a ground reference potential and connected to the source terminal of the device by the relay matrix 12. Two other SMUs, 48 and 50, are respectively connected to the gate and drain terminals of the device. A fourth SMU 52 is connected in common to each of the bulk, substrate and chuck terminals of the device. The values of the latter three SMUs are determined in accordance with the input measurement parameters. More particularly, the voltage of the SMU 48 connected to the drain of the device is determined by the specified drain-to-source input value. Similarly, the voltage output of the SMU 52 connected to the bulk, substrate and chuck terminals is determined by the specified bulk-to-source bias input value. The output voltage of the SMU 50 connected to the gate of the device is first set in accordance with the specified gate-to-source bias voltage for the FET when it is in the "off" state.

Once each of the SMUs has been connected to a respective pad of the device and set to the appropriate value, the drain current through the device is measured, and this value is assigned to the corresponding output variable. Then, the value of the SMU 50 is changed in accordance with the specified gate-to-source bias voltage for the FET "on" state and the drain current is again measured. This measured value is assigned to another corresponding output variable for the algorithm.

These two measured values can then be used to determine a status code for the measured device. Table I below illustrates one example of a status code that can be assigned for each of the four possible output conditions:

TABLE I

| $I_d(off) > I_d(off)max$ | $I_d(on) < I_d(on)min$ | Status |
|---|---|---|
| No | No | 0 |
| Yes | No | 1 |
| No | Yes | 2 |
| Yes | Yes | 3 | where $I_d(off)$ is the measured drain current when the transistor is off;
$I_d(on)$ is the measured drain current when the transistor is on;
$I_d(off)max$ is the specified maximum drain current when the transistor is off;
$I_d(on)min$ is the specified minimum drain current when the transistor is on;

The flexibility provided by the modular approach of the present invention enables the testing sequence to be dynamically varied in response to the results of measurements. In particular, each measurement algorithm can generate one or more control codes in response to the measured parameter to indicate certain types of defects. For example, in the example described above any status code other than zero indicates that the FET is not viable and does not warrant further testing. Such a status code can be used to generate another type of output result, labeled a test sequence indicator, which may indicate a defective device. Other types of measurement algorithms may return test sequence indicators that indicate a desired change in the testing sequence such as skip to the next measurement, go to the next module or even abort all further tests on the wafer. In response to these indicators, the general test program can terminate all further testing in the measurement, device, module, die or wafer, as the case may be, and move on to the next appropriate structure to be tested.

Figure 8:
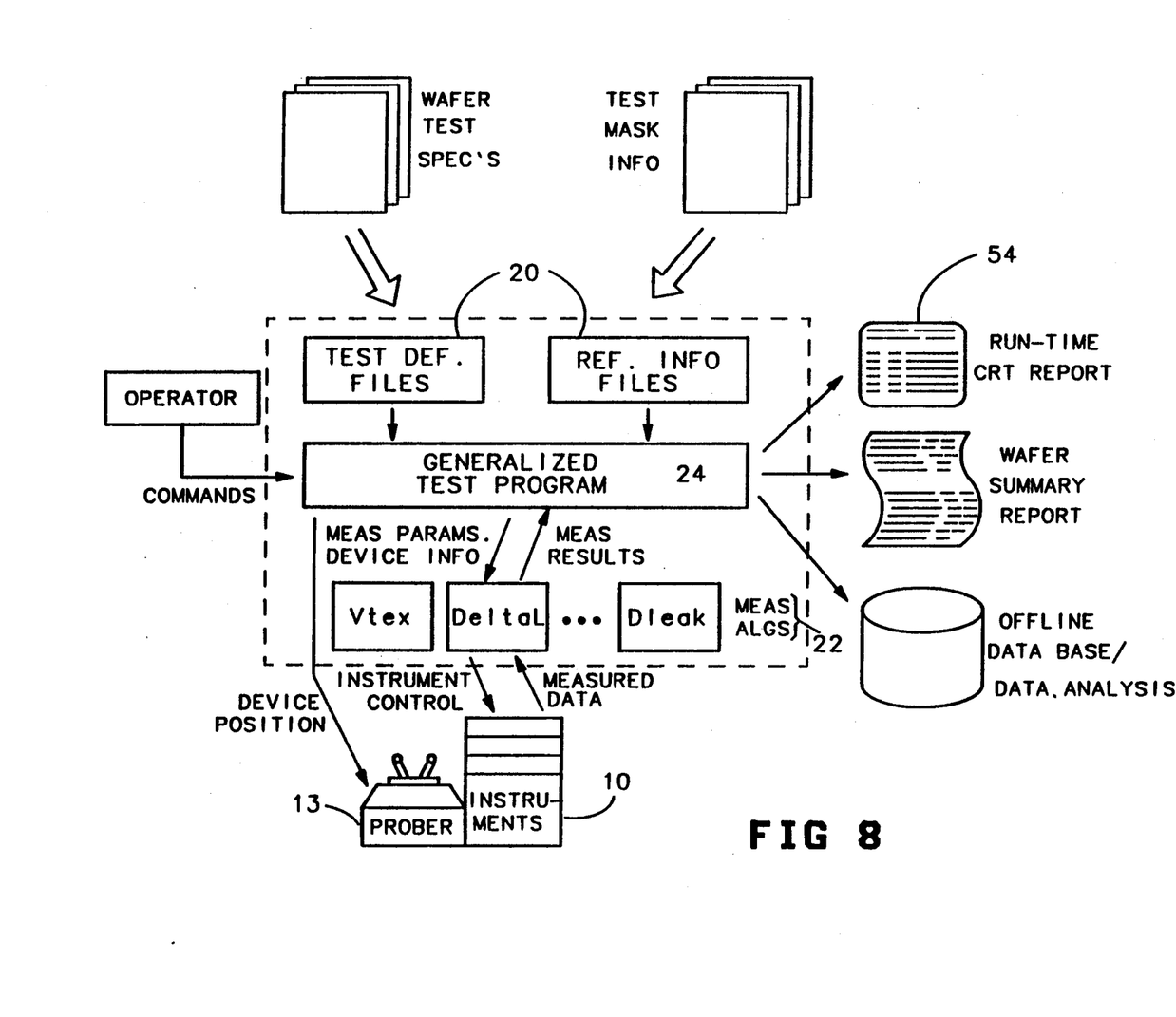
FIG. 8 is a schematic illustration of the operation of the general test program.
Figure 9:
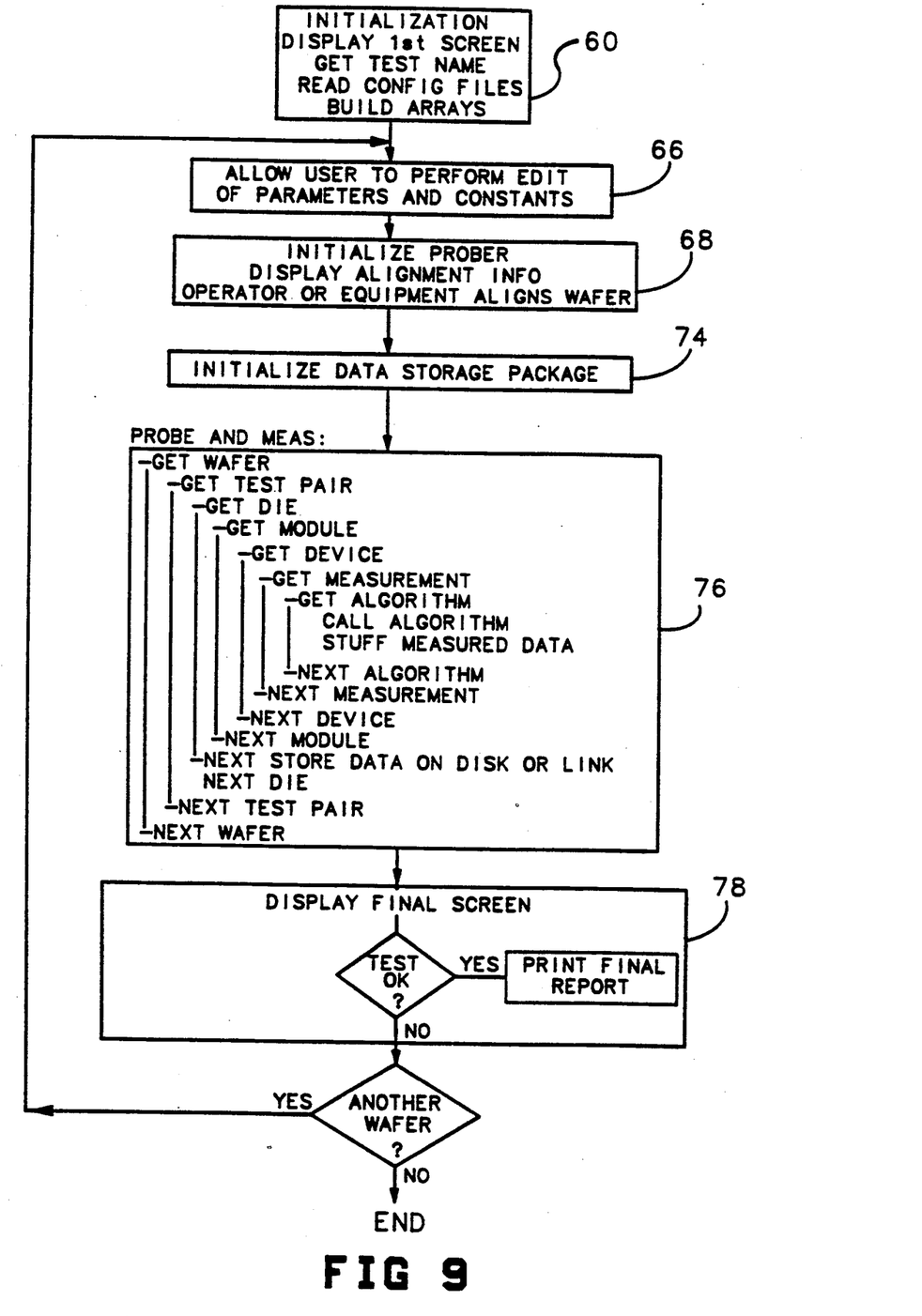
FIG. 9 is a flow chart of the operation of the general test program.

As indicated in the foregoing, the execution of the test procedure is carried out by the general test program 24. The basic operation of the program is schematically illustrated in FIG. 8, and a flow chart of the major steps in the operation of the program are shown in FIG. 9. After the program has been initialized and the first user interaction screen is displayed on a CRT (step 60 in FIG. 9), the operator enters a test name as well as other administrative information relating to the test to be carried out. The test program obtains all information from the reference information and test definition files stored within the configuration file library 20 that are associated with that particular test. After ensuring that there are no syntax errors or inconsistencies, this information is stored into memory arrays for subsequent access by the program.

After all of these initial steps have been carried out, the program proceeds to step 66, where it permits the user to perform run-time editing of parameters and user-defined constants. At the completion of this step, the general test program performs any necessary initialization of the wafer prober and displays alignment information (step 68). For example, if the system is operating in the manual load mode, it may display appropriate diagrams showing where to align the wafer and request the user to indicate when the wafer is properly aligned. If the equipment has automatic loading and alignment capability, the first wafer is aligned automatically and the operator is asked to verify the alignment. All subsequent wafers are loaded and aligned without operator intervention for automatic wafer loaders. Once the alignment is completed, the general test program initializes the data storage package in step 74. This step initializes the files and communication links necessary to store the results of measurements in a predefined format.

Once the system has been appropriately configured through the foregoing steps, the general test program proceeds to the probe-and-measure routine 76. In this routine the program scans the stored configuration file data, determines which tests to perform, moves the prober to the selected location and calls the algorithms to perform the tests. The measurement process proceeds in the hierarchical sequence specified in the test definition files without any further interaction on the part of the operator.

The probe-and-measure routine essentially comprises a set of nested loops, with the loops respectively pertaining to one of the items in the testing hierarchy. More particularly, there is a loop for test pairs, each of which consists of the combination of selected dice (FIG. 5) and a device/measurement set (FIG. 6) specified by the user. Other loops are respectively associated with the die, module, device, measurement and algorithm levels of the hierarchy. An outer loop is provided to cause successive wafers to be sequentially loaded.

Figure 10:
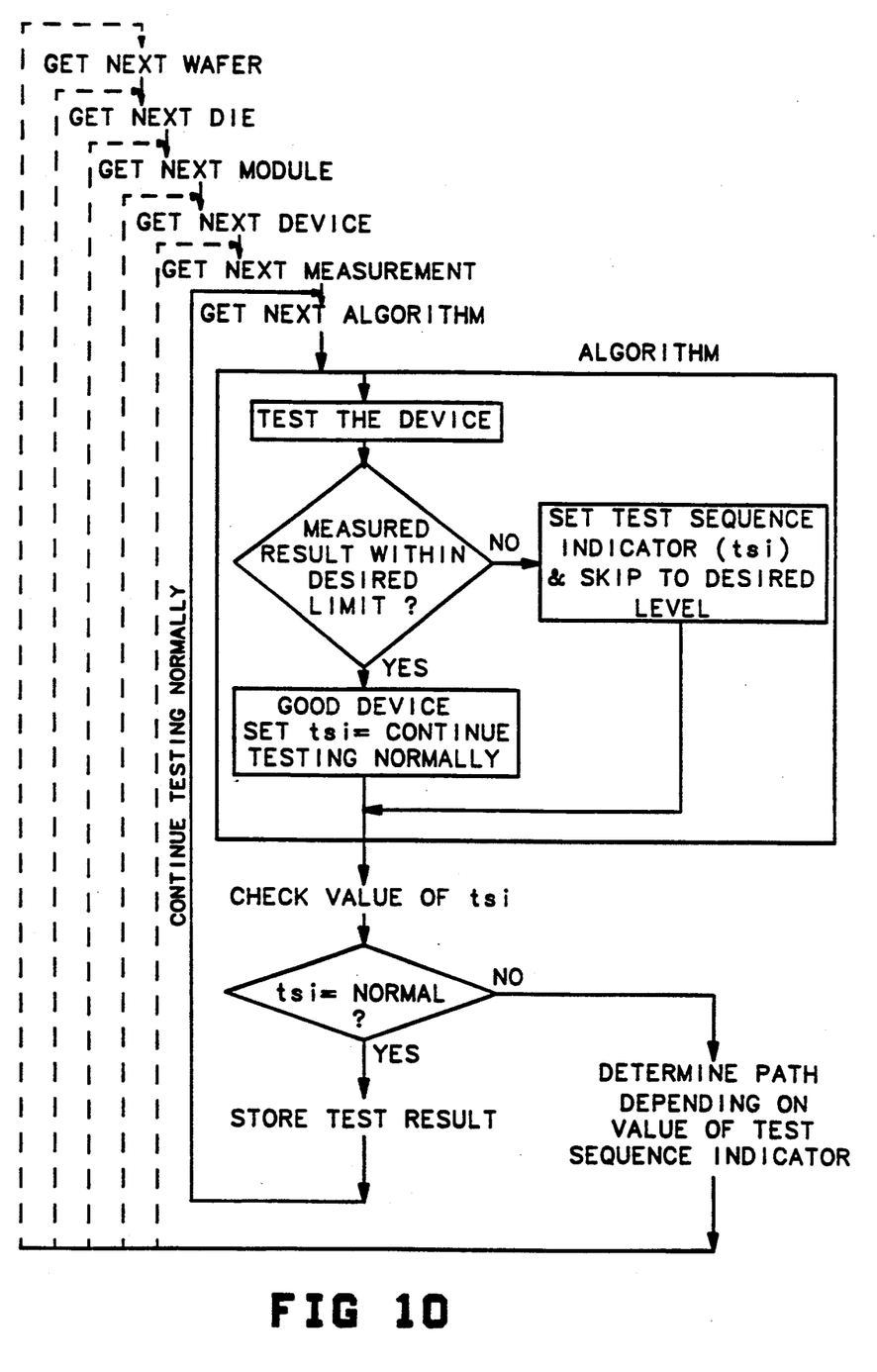
FIG. 10 is a flow chart of the test sequence alteration routine.

Within the innermost algorithm loop, the input variables for the selected algorithm are retrieved and placed in suitable arrays or memory buffers to be sent to the algorithm. The algorithm itself is then called and controls the tester's instruments 10 to perform the desired measurements, as explained previously. Once the measurements have been executed, the result data is returned to the general test program. This data is entered into an appropriate cell in the array constructed in step 60. The test sequence indicator returned by the algorithm is also checked by the general test program. If the indicator instructs the program to branch out of the normal sequence, for example due to a defective device or module, the appropriate number of loops are exited by the general test program to proceed to the next structure to be tested. This operation is depicted in the flow chart of FIG. 10.

The general test program proceeds in the sequence determined by the test specifications entered by the process engineer on the device/measurement matrix 42 of FIG. 6. Preferably, once the pins of the wafer prober 14 are placed on the contact pads of a module, all desired tests on the devices within that module are carried out before the prober is retracted and moved to the next module, thereby minimizing prober movement. Thus, once the prober is in place on a module, the general test program sequentially accesses the measurement algorithms to carry out the desired tests. If the results of any test return a status code that signifies a defective structure, the test program 24 ignores all further test for that structure and branches to the test routines for the next selected structure, as explained previously.

If desired, a continuously updated report can be provided on an I/O device such as a CRT screen 54 or printer to inform the user of the most recent measurement results and status information. Once the test sequence of the routine 76 has been completed, a statistical summary report can be generated on a printer (step 78). If specified as part of the test procedure, the general test program can also format and transmit measurement results to a database for off-line data analysis. These reports can be generated at any desired frequency, for example once per die.

Figure 11:
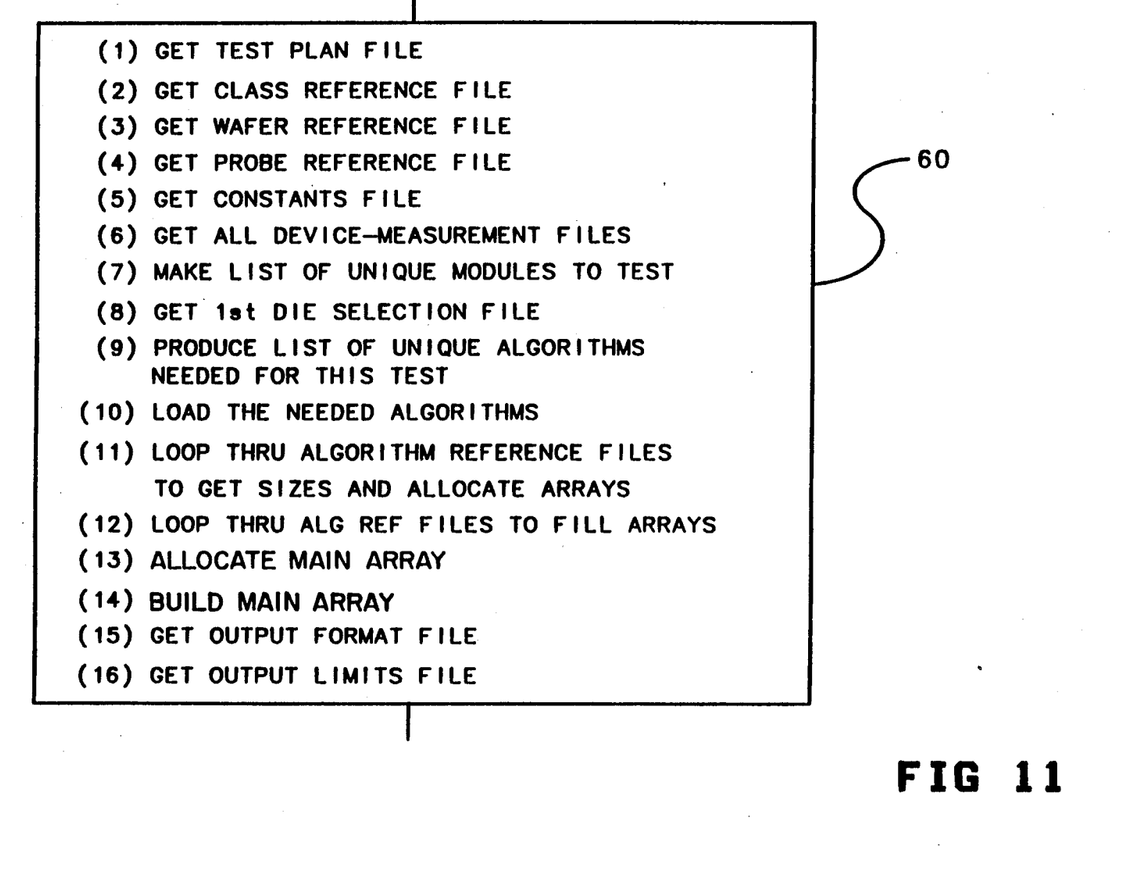
FIG. 11 is a flow chart of the routine for retrieving reference and test definition information and constructing the data arrays.

The procedure for reading the configuration files and building the arrays within program step 60 is shown in greater detail in FIG. 11. As shown therein, the first six steps involve getting an initial set of reference information and test specification files that pertain to the devices to be tested; remaining files are read as indicated below and in FIG. 11. Once these files are retrieved, the general test program determines which modules are to be tested (step 7), and from this information determines the module reference files that need to be read. The program then retrieves the first die selection file, determines which measurement algorithms will be required and appends them to the general test program, setting up arrays for the input variables required by each.

The general test program next proceeds to the allocation of memory space and building of a main array. The main array is filled with all of the information that is saved for each tested result. For example, the columns of the array can each be assigned to one of the pieces of information that is saved. Some of these pieces of information could be the name of the result, its unit of measure, the value of result itself, statistical analyses of the results over one die or all dice, and sets of limits that are used to determine status codes or test sequence indicators. Each row of the array would be assigned to one result and filled as the algorithm relating to that result is carried out.

As a further function, the general test program can provide a unique identifier for each test result that is obtained during the testing sequence. One manner in which such a unique identifier can be provided is to concatenate the names of the algorithm, its output result, the device and the die. For example, the second measurement that is taken with an algorithm ID on a device ABC on a die XYZ could be named ID-Out-2ABC-XYZ. The user can be provided with the option to substitute a different (more meaningful) name for the output result portion of the identifier, such as ID-Drain Current-ABC-XYZ. This assigns a unique data identification code to each receiver result.

As a result of the unique identification of each measurement result, previous test results can be used for subsequent parameter passing in later tests as well as for more informed data analysis. A naming convention such as that described above is easily human readable and clearly identifies the source of the test result, independently of the actual testing sequence. In addition, it saves the user from having to develop hundreds of names which might be easily forgotten or which may not clearly identify the result. This capability facilitates the variation of the test sequencing without affecting test results.

From the foregoing it can be appreciated that the modular test program approach provided by the present invention offers a number of advantages over the heretofore conventional practice of hard coding an entire test sequence from start to finish in a custom program. The approach of the present invention provides for separation of device-under-test descriptions from specific test definitions, and thereby allows numerous engineers to perform different tests on the same type of wafer and/or device without having to repeatedly describe the wafer and device. Since the general test program is the same for every test, it is inherently reused and provides uniformity of function and result in various features such as operator interface, report formats, data format and general test creation process. Further, because there is only a single general test program it is much more robust and easily supported, independent of the ultimate number of tests that it is to be used for.

Similarly, because the measurement algorithms are modular and generic, they can be reused in any test which requires the particular type of measurement to which each relates. This feature promotes sharing of the program among test system sites. Furthermore, because of their reusability the measurement algorithms promote standardization, which further facilitates testing uniformity. In addition, their modularity and defined input/output protocols for interchange with the general test program promote user creation of additional measurement algorithms.

The use of individual worksheets and standardized files to enter and store all of the appropriate information pertaining to a test results in a form of readily understandable self-documentation, making the tests much easier to maintain. Furthermore, they simplify the task of specifying measurements, for example as illustrated in FIG. 6 with respect to a device/measurement selection matrix.

The modular and standardized approach of the present invention also provides significant flexibility that enables each test procedure to be optimized. For example, the ability to specify different input parameters for the individual measurement algorithms enables the user to define a single constant to be used as an input variable in a number of measurements within a test. In addition, the result obtained in any measurement can be used as an input variable in subsequent measurements without the need for user interaction between the measurement steps. Furthermore, actual measurement results can be used as a basis for dynamically altering the test sequence, and thereby avoid test steps that are rendered unnecessary once a particular result is obtained.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A control system for an automated parametric test system of the type in which test signals are applied to devices on an integrated circuit wafer and the responses of the devices to said test signals are measured to determine the performance of the devices, comprising:
    a first memory means for storing location information pertaining to the configuration of a plurality of devices within a die on one wafer;
    a second memory means for storing a plurality of measurements to be applied to various ones of said devices to determine a characteristic parameter of each device;
    the second memory means for storing specifications for particular tests to be performed on particular devices on a wafer whose configuration is stored in said first memory means; and
    a control means responsive to a set of specifications stored in said third means to select a measurement stored in said second memory means, determine the location of a device to which the selected measurement is to be applied on the basis of the information stored in said first memory means, and control said test system to supply the selected measurement to the device at said determined location on the wafer, said control means for interpreting information stored in said first and third memory means and for calling predetermined information from said second memory means.

2. The control system of claim 1 wherein the measurements are stored in said second memory means in terms of generic classes of devices, and said control means retrieves information about a specific device from said first memory means to enable a stored measurement to be applied to said specific device.

3. The control system of claim 2 wherein said measurements include a set of input variables which determine the values of signals to be applied to a device to be tested, and said variables are stored in said third memory means.

4. The control system of claim 3 wherein at least one of said variables stored in said third memory means for one of said measurements is defined in terms of a result that is obtained from another one of said measurements.

5. The control system of claim 1 wherein said control means receives a result for each applied measurement and assigns a unique data identification code to each received result.

6. The control system of claim 1 wherein the location where a selected measurement is to be applied is specified in terms of a set of coordinates having an origin at a predetermined point relative to the wafer.

7. The control system of claim 6 wherein said devices are located within dice on the wafer and said set of coordinates comprises a first pair of coordinates which indicate the location of a reference point on a die relative to said predetermined point, and a second pair of coordinates which indicate the location of a test point relative to said reference point.

8. The control system of claim 1 wherein said control means applies multiple measurements in a sequence determined by the specification stored in said third memory means, and an applied measurement taken from one of said plurality of measurements provides an indication of the status of a tested device to said control means, and wherein said control means is responsive to said indication to alter said sequence.

9. The control system of claim 8 wherein said control means skips one or more of the measurements in said sequence in response to said indication.

10. A control system for an automated parametric test system of the type in which test signals are applied to devices on an integrated circuit wafer and the responses of the devices to the test signals are measured to determine the performance of the devices, comprising:
    a first memory means for storing location information pertaining to the configuration of a plurality of devices within a die on one wafer;
    a second memory means for storing a plurality of measurements to be applied to various ones of the devices to determine a characteristic parameter of each device;
    a third memory means for storing specifications for particular tests to be performed on particular devices on a wafer whose configuration is stored in the first memory means; and
    a control means responsive to a set of specifications stored in the third memory means to select a measurement stored in the second memory means, determine the location of a device to which the selected measurement is to be applied on the basis of the information stored in the first memory means, and control the test system to apply the selected measurement to the device at the determined location on the wafer, said control means for interpreting information stored in said first and third memory means and for calling predetermined information from said second memory means.

11. The control system of claim 10 wherein the measurements are stored in the second memory means in terms of generic classes of devices, and the control means retrieves information about a specific device from the first memory means to enable a stored measurement to be applied to the specific device.

12. The control system of claim 11 wherein the measurements include a set of input variables which determine the values of signals to be applied to a device to be tested, and wherein the values of the input variables are stored in the third memory means.

13. The control system of claim 10 wherein the location where a selected measurement is to be applied is specified in terms of a set of coordinates having an origin at a predetermined point relative to the wafer.

14. The control system of claim 10 wherein the control means applies multiple measurements in a sequence determined by the specification stored in the third memory means, and an applied measurement taken from one of said plurality of measurements provides an indication of the status of a tested device to the control means, and wherein the control means is responsive to the indication to alter the sequence.

* * * * *